(12) United States Patent
Zhou

(10) Patent No.: US 10,608,125 B1
(45) Date of Patent: Mar. 31, 2020

(54) EXPOSED DIE SENSOR PACKAGE

(71) Applicant: Maxim Integrated Products, Inc., San Jose, CA (US)

(72) Inventor: Tiao Zhou, Carrollton, TX (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 207 days.

(21) Appl. No.: 14/039,637

(22) Filed: Sep. 27, 2013

Related U.S. Application Data

(60) Provisional application No. 61/820,330, filed on May 7, 2013.

(51) Int. Cl.
| | |
|---|---|
| *H01L 31/0203* | (2014.01) |
| *H01L 27/146* | (2006.01) |
| *H01L 25/065* | (2006.01) |
| *H01L 25/16* | (2006.01) |

(52) U.S. Cl.
CPC .... *H01L 31/0203* (2013.01); *H01L 27/14618* (2013.01); *H01L 27/14634* (2013.01); *H01L 27/14636* (2013.01); *H01L 25/0657* (2013.01); *H01L 25/167* (2013.01)

(58) Field of Classification Search
CPC ........... H01L 31/02002; H01L 31/0224; H01L 23/538; H01L 23/5389; H01L 27/14634; H01L 27/14636; H01L 31/0203; H01L 25/0657; H01L 25/167; H01L 27/1469
See application file for complete search history.

(56) References Cited

U.S. PATENT DOCUMENTS

| | | | | |
|---|---|---|---|---|
| 2001/0004128 A1* | 6/2001 | Park | .................. | H01L 27/14618 257/680 |
| 2004/0070064 A1* | 4/2004 | Yamane | .............. | H01L 23/3114 257/686 |
| 2007/0246806 A1* | 10/2007 | Ong | .................... | H01L 23/3128 257/666 |
| 2009/0166785 A1* | 7/2009 | Camacho | ............ | H01L 21/6835 257/433 |
| 2009/0309202 A1* | 12/2009 | Hsu | ...................... | H01L 23/3128 257/680 |
| 2010/0327429 A1* | 12/2010 | Ou | ........................ | H01L 21/568 257/698 |
| 2012/0217607 A1* | 8/2012 | Hanai | ............... | H01L 27/14618 257/448 |
| 2012/0306038 A1* | 12/2012 | Chow | ............... | H01L 27/14636 257/434 |
| 2012/0326286 A1* | 12/2012 | Camacho | .......... | H01L 23/49861 257/676 |
| 2013/0164867 A1* | 6/2013 | Ramasamy | ....... | H01L 27/14618 438/25 |

\* cited by examiner

*Primary Examiner* — Changhyun Yi
(74) *Attorney, Agent, or Firm* — Kevin E. West; Advent, LLP

(57) ABSTRACT

Packaging techniques are described for fabricating an sensor package that include one or more sensor devices, such as optical sensors or light sources, where an active side of the sensor device is exposed. Additionally, the side of the sensor package including the sensor die is substantially flat (e.g., topology is less than about 75 μm), the sensor package does not include wire bonding, and the package interconnect (e.g., solder bump array or other connection) is disposed on a side of the sensor package opposite the sensor die.

19 Claims, 5 Drawing Sheets

EXPOSED DIE SENSOR PACKAGE

CROSS-REFERENCE TO RELATED APPLICATIONS

The present application claims the benefit under 35 U.S.C. § 119(e) of U.S. Provisional Application Ser. No. 61/820,330, filed May 7, 2013, and titled "EXPOSED DIE SENSOR PACKAGE." U.S. Provisional Application Ser. No. 61/820,330 is herein incorporated by reference in its entirety.

BACKGROUND

Electronic devices, such as smart phones, tablet computers, digital media players, and so forth, increasingly employ sensors to control the manipulation of a variety of functions provided by the device. For example, optical sensors are commonly used by electronic devices to detect ambient lighting conditions in order to control the brightness of the device's display screen. Similarly, optical sensors are commonly used in proximity and gesture sensing applications. Proximity and gesture sensing enables the detection of physical movement (e.g., "gestures") without the user actually touching the device within which the sensing device resides. The detected movements can be subsequently used as input commands for the device.

SUMMARY

Packaging techniques are described for fabricating a sensor package that include one or more sensor and emitter devices, such as an optical sensor or a light source, where an active side of the sensor device is exposed. Additionally, the side of the sensor package including the sensor die is substantially flat (e.g., topology is less than about 75 µm), the sensor package does not include wire bonding, and the package interconnect (e.g., solder bump array or other connection) is disposed on a side of the sensor package opposite the sensor die.

In implementations, the sensor package device includes a substrate, a sensor die, at least one via, a redistribution layer structure, a contact pad, and a dielectric layer. Additionally, the sensor package may include at least one additional die, a filter, and/or a protective layer disposed on the active side of the sensor die. In implementations, fabricating the sensor package device includes forming and/or receiving a substrate, placing the sensor die on the substrate, forming at least one via, forming a redistribution layer structure, forming a dielectric layer, and forming an interconnect layer (e.g., a solder bump array).

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Current packaging solutions for sensors are very complex with complicated package constructions, significant tooling costs, and marginal reliability. Optical sensors often require that the sensor die be "visually" exposed to the external environment. Current methods and materials relating to sensor devices can be expensive and difficult to integrate into typical electronic package construction without significantly increasing the complexity of the assembly process as well as a significant increase in tooling charges associated with the assembly technology. Additionally, package reliability may be decreased when using transparent molding compounds and/or encapsulation. For example, connections are often compromised (e.g., wire breaking) and delamination can occur (e.g., transparent molding often has a large CTE (60 ppm/C) and chemical shrinkage (1.5%)) when using transparent molding compounds.

Accordingly, packaging techniques are described for fabricating a sensor package that includes one or more sensor devices, such as optical sensors or light sources, where an active side of the sensor device is exposed. Additionally, the side of the sensor package including the sensor die is substantially flat (e.g., topology is less than about 75 µm), the sensor package does not include wire bonding, and the package interconnect (e.g., solder bump array or other connection) is disposed on a side of the sensor package opposite the sensor die.

In implementations, the sensor package device includes a substrate, a sensor die, at least one via, a redistribution layer structure, a contact pad, and a dielectric layer. Additionally, the sensor package may include additional die and/or a filter or protective layer disposed on the active side of the sensor die. In implementations, fabricating the sensor package device includes forming or receiving a substrate, placing the sensor die on the substrate, forming at least one via, forming a redistribution layer structure, forming a dielectric layer, and forming an interconnect layer (e.g., a solder bump array).

Example Implementations

Figure 1A:
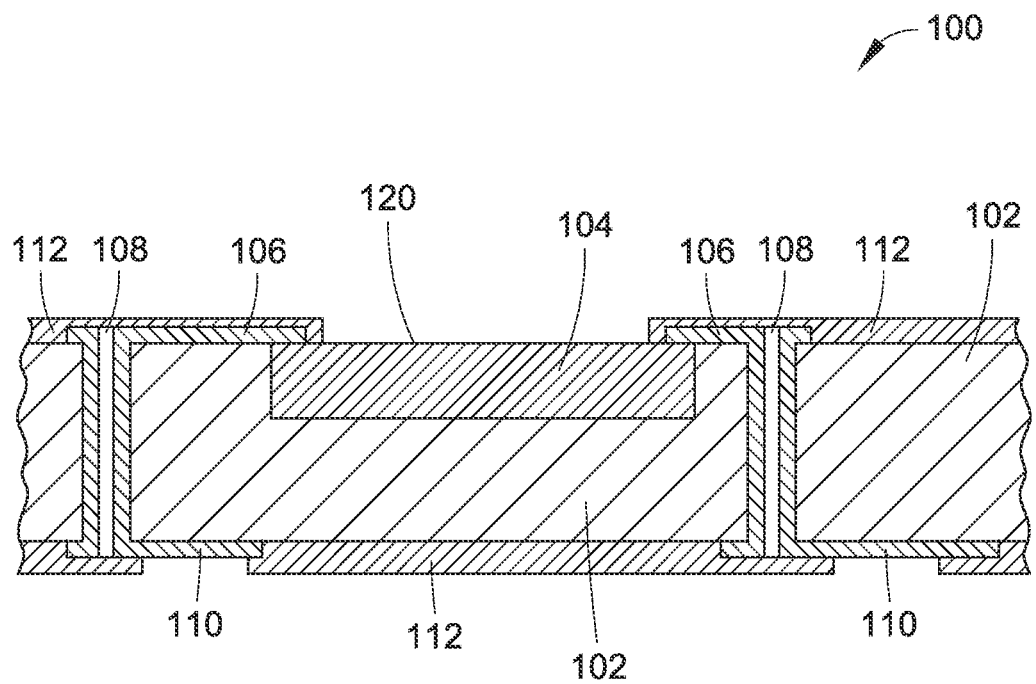
FIG. 1A is a diagrammatic partial cross-sectional side elevation view illustrating a sensor package in accordance with example implementations of the present disclosure.
Figure 1B:
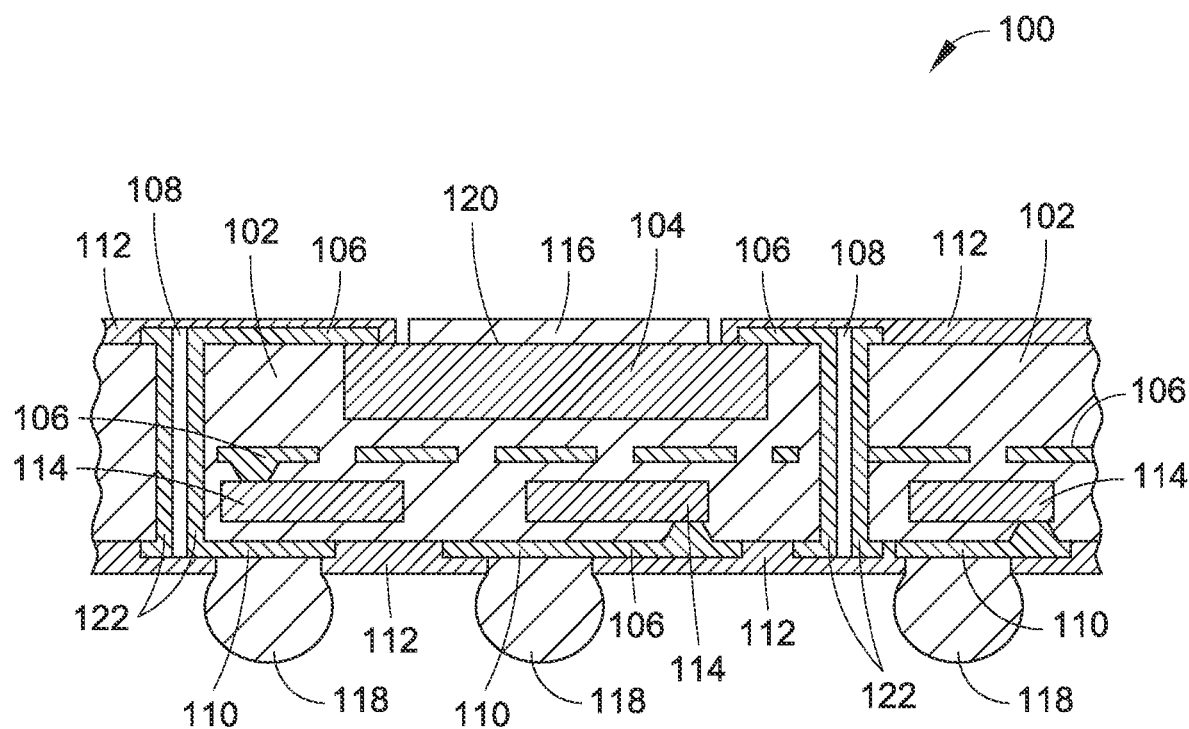
FIG. 1B is a diagrammatic partial cross-sectional side elevation view illustrating a sensor package in accordance with example implementations of the present disclosure.

FIGS. 1A through 1B illustrate a sensor package 100 in accordance with example implementations of the present disclosure. As shown, the sensor package 100 includes a substrate assembly 102. One or more sensor die 104 are mounted to and/or formed as a portion of the substrate assembly 102.

In embodiments, the substrate assembly 102 may include a substrate. In such embodiments, the substrate assembly 102 may be fabricated as a portion of (e.g., singulated from) a semiconductor substrate, such as a silicon wafer, a germanium wafer, and so forth, and in some implementations may include one or more integrated circuits formed therein. In other embodiments, it is contemplated that the substrate assembly 102 may comprise a printed circuit board or other suitable substrate. Additionally, the substrate assembly 102 may include multiple layers of metals or other materials.

A sensor die 104 is placed on or formed as a portion of the substrate assembly 102. In an embodiment, a sensor die 104 is placed in a cavity of the substrate assembly 102. In implementations, the sensor die 104 may include optical sensors (e.g., photodetectors such as phototransistors or photodiodes, and so forth), light sources (e.g., light emitting diodes (LED)), chemical sensors, bio-sensors, or combinations thereof, etc. As shown, the sensor die 104 can be disposed on and formed within the substrate assembly 102, where the active side of the sensor die 104 is exposed. For example, in embodiments, the sensor die 104 may be disposed within the substrate assembly 102 so that the side of the sensor package 100 with the sensor die 104 is substantially flat (e.g., the topology is less than about 75 μm). In implementations, the sensor die 104 may be electrically coupled to the sensor package 100 so that no wires (e.g., bonding wires) are used. In these implementations, using connection methods other than wire bonding avoids the potential for the wires breaking or otherwise becoming faulty.

In some implementations, the sensor die 104 may include a protective layer 116. Some examples of a protective layer 116 may include a color filter, an ultraviolet light filter, a thin film, or a transparent polymer, etc. Further, the sensor package may include additional embedded dice 114. These dice 114 may be embedded or formed as a part of the substrate assembly 102 and may be electrically connected by conductive layers such as plated through holes 108 and/or a redistribution layer 106. The additional dice 114 may include other sensors and/or passive devices (e.g., resistor, capacitor, inductor, etc.).

The sensor package 100 includes electrical interconnections (e.g., through-hole vias, redistribution layers 106, metal pads 110, etc.) configured to provide electrical connectivity between the substrate assembly 102, the sensor die 104, and/or an external device (e.g., a printed circuit board). The electrical interconnections may be configured in a variety of ways. For example, in FIGS. 1A and 1B, the sensor package 100 illustrated employs a redistribution layer 106 and plated through holes 108. In such implementations, the sensor package 100 can be fabricated using Wafer-Level Chip Scale Packaging technologies to facilitate electrical interconnection of the device(s) with the backside interconnects (e.g., metal contact pads 110). The electrical interconnections can provide electrical contacts through which the sensor die 104 are interconnected to external components, such as other packages, printed circuit boards, and so forth.

In implementations, a redistribution layer 106 is utilized as an electrical interconnection between the sensor die 104 and other components of the sensor package 100. The redistribution layer 106 can include a thin-film metal (e.g., aluminum, copper, etc.) rerouting and interconnection system that redistributes the conductive layers to a contact pad 110 (e.g., under-ball metalization (UBM pads)) or an area array of solder bumps 118 that may be evenly deployed over the surface of the sensor package 100. Solder bumps 118 may be subsequently placed over these metal pads 110 using wafer-level chip scale packaging techniques.

The sensor package 100 can also include a plated through hole 108 (e.g., a through-hole via or through-silicon via (TSV)) that extends at least partially through the substrate assembly 102 from one side of the sensor package 100 (e.g., the side with the sensor die 104) to the opposite side of the sensor package 100 (e.g., the side with the interconnects). As illustrated in FIGS. 1A and 1B, the plated through holes 108 can include a conductive material 122 that furnishes an electrical interconnection between a first conductive layer (e.g., a redistribution layer 106) of substrate assembly 102 and a second conductive layer (e.g., contact pad 110). In one or more implementations, the conductive material 122 may include a metal material (e.g., copper, aluminum, etc.).

At least one contact pad 110 can be disposed on the interconnect side of the sensor package 100. In implementations, the contact pad 110 may include, for example, metal pads (e.g., copper, aluminum), under-ball metallization (UBM), etc., configured to provide an electrical connection between the sensor die 104 (by way of the redistribution layer, vias, and other electrical interconnections) and an external component (e.g., a printed circuit board, not shown).

A passivation layer 112 can be formed on at least one side of the sensor package 100. The passivation layer may include an electrical insulator that functions as an insulator and/or a protective layer for the sensor die 104 and/or other components of the sensor package 100 from later fabrication steps and environmental factors. In one implementation, the passivation layer 112 can include a layer of silicon dioxide ($SiO_2$) formed on both sides of the sensor package 100 while not covering the contact pads 110 or the sensor die 104. In another implementation and depending on the fabrication process, the passivation layer 112 may include a soldermask. In other implementations, the passivation layer 112 may also include a thin film (e.g., benzocyclobutene (BCB), etc.).

In some implementations, at least one solder bump 118 can be formed on the substrate assembly 102. Solder bumps 118 can be provided to furnish mechanical and/or electrical interconnection between the contact pads 110 and corresponding pads formed on the surface of a printed circuit board (not shown) or another semiconductor device. In one or more implementations, the solder bumps 118 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. In some implementations, Tin-Lead (PbSn) solders may be used.

Example Fabrication Processes

Figure 2:
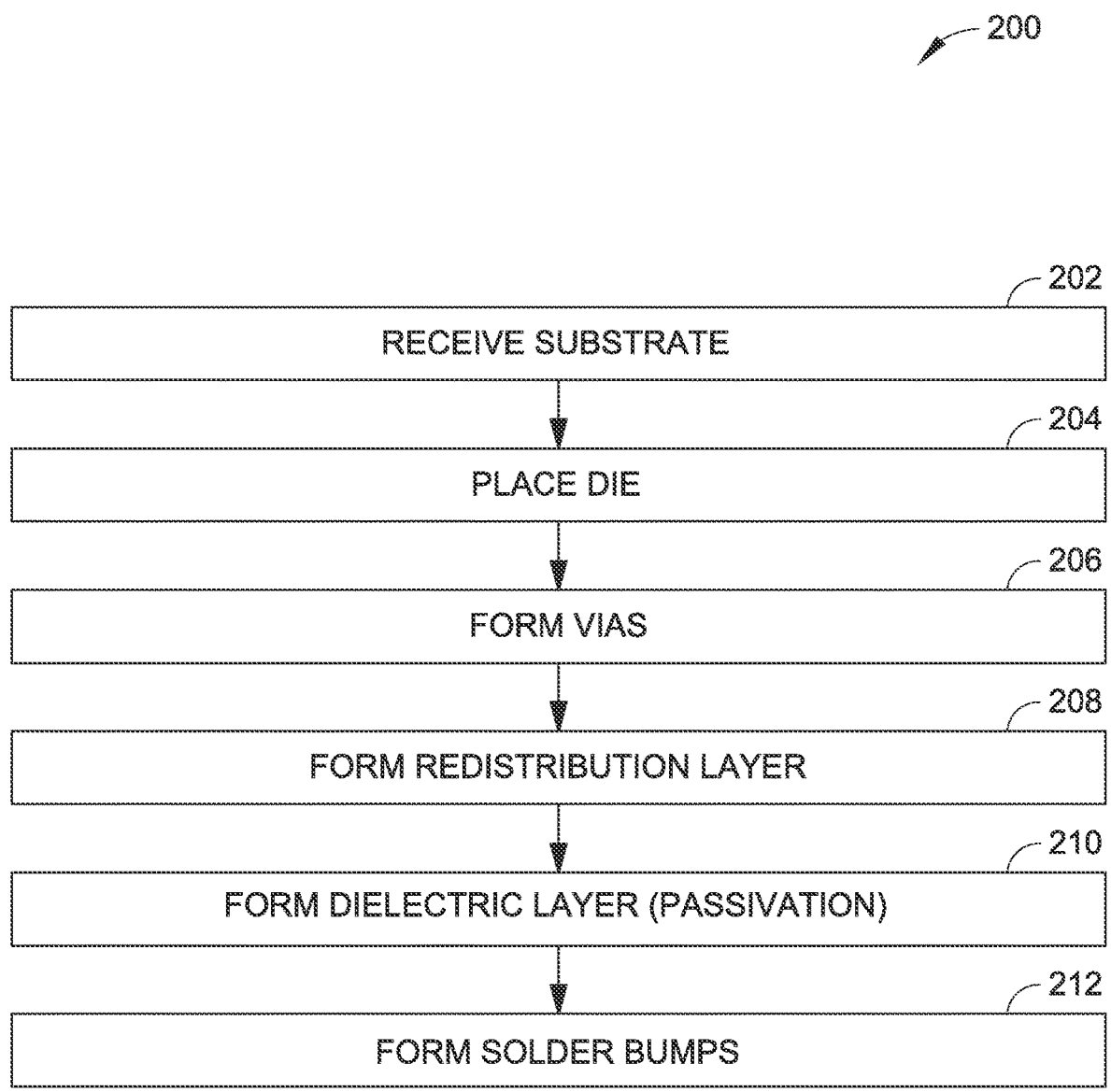
FIG. 2 is a flow diagram illustrating a process in an example implementation for fabricating sensor packages, such as the sensor packages shown in FIGS. 1A through 1B.

FIG. 2 illustrates an example process 200 that employs sensor packaging techniques to fabricate sensor packages including packages with exposed die sensor packages, such as the sensor package 100 shown in FIGS. 1A through 1B. FIGS. 3A through 3D illustrate sensor package 300 of an example substrate assembly 302 and sensor die 304 that are utilized to fabricate semiconductor devices (such as sensor packages 100 shown in FIGS. 1A and 1B).

Figure 3A:
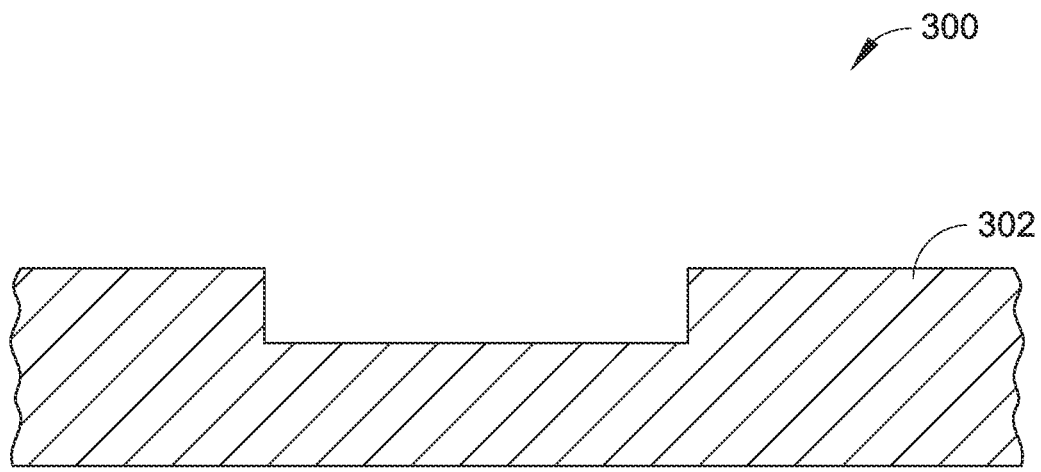
FIG. 3A is a diagrammatic partial cross-sectional side elevation view illustrating the fabrication of a sensor package, such as the device shown in FIGS. 1A and 1B, in accordance with the process shown in FIG. 2.

As illustrated in FIG. 3A a substrate assembly is received or formed (Block 202). In the sensor package 300 illustrated in FIG. 3A, receiving a section of the substrate assembly 302 is illustrated prior to placing a sensor die 304 on the substrate assembly 302. In the embodiment illustrated, the sensor package 300 includes receiving a semiconductor substrate. In some embodiments, receiving the substrate assembly 302 may include forming the substrate assembly 302, where the substrate assembly 302 may be fabricated as a portion of (e.g., singulated from) a semiconductor wafer, such as a silicon wafer, a germanium wafer, and so forth, and may include one or more integrated circuits formed therein. In further embodiments, it is contemplated that the substrate assembly 302 may comprise a printed circuit board, or other suitable substrate.

Figure 3B:
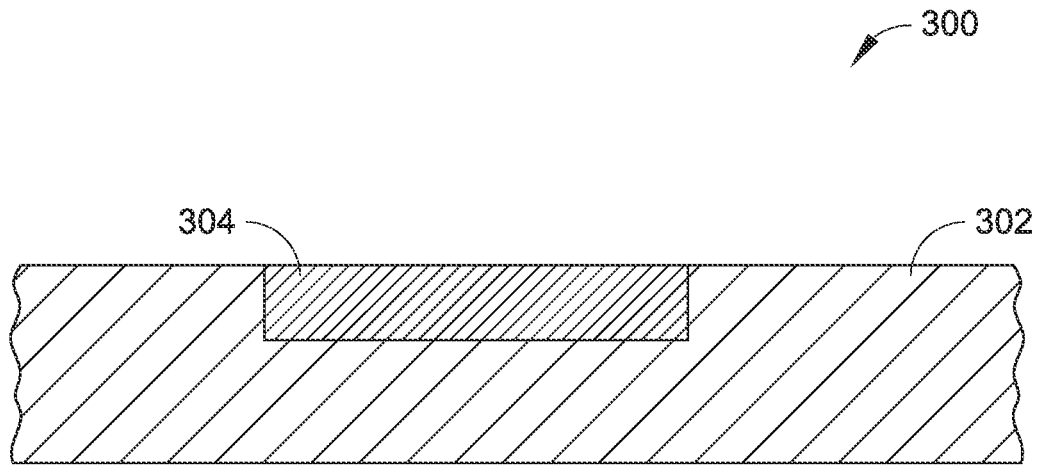
FIG. 3B is a diagrammatic partial cross-sectional side elevation view illustrating the fabrication of a sensor package, such as the device shown in FIGS. 1A and 1B, in accordance with the process shown in FIG. 2.

A sensor die is placed on the substrate assembly (Block 204). As illustrated in FIG. 3B, placing a sensor die 304 can include placing a sensor die 304 in a cavity of a substrate assembly 302. As noted above, the sensor die 104 may comprise an optical sensor (e.g., a photodetector, such as a phototransistor or photodiode, and so forth), a light source (e.g., a light emitting diode (LED)), combinations thereof, etc. In implementations, the sensor die 104 may be placed or formed as a part of substrate assembly 102. In the embodiment illustrated, the sensor device is formed as a portion of or in a cavity formed in the semiconductor substrate assembly 102 using pick-and-place techniques or other suitable techniques. Additionally, placing the sensor die 304 can include depositing an adhesive material for securing the sensor die 304 to the substrate assembly 302.

Figure 3C:
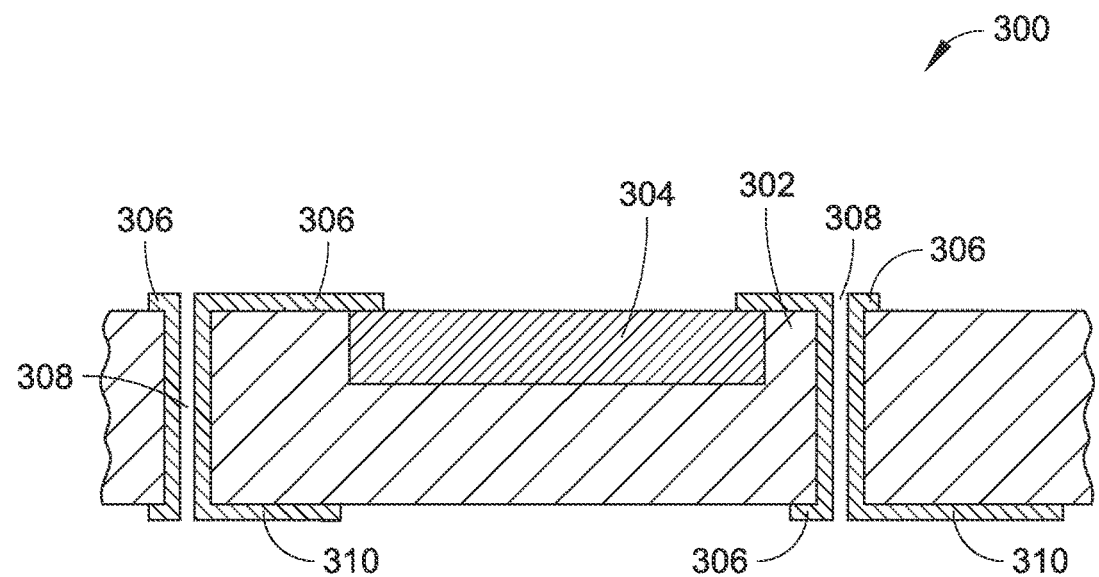
FIG. 3C is a diagrammatic partial cross-sectional side elevation view illustrating the fabrication of a sensor package, such as the device shown in FIGS. 1A and 1B, in accordance with the process shown in FIG. 2.

At least one via is formed in the substrate (Block 206) and a redistribution layer is formed in the substrate (Block 208). As shown in FIG. 3C, forming at least one via 308 and at least one redistribution layer 306 can be implemented using semiconductor fabrication techniques, such as photolithography, deposition, and etching, for example. The at least one via 308 and redistribution layer 306 can be configured to provide electrical connectivity between the substrate assembly 302, the sensor device 304, and/or other components. In such implementations, the sensor die 304 may be fabricated using Wafer-Level Chip Scale Packaging technologies and/or may employ vias 308 (e.g., through-substrate (or silicon) vias (TSVs)) to facilitate electrical interconnection of the sensor die 304 with the backside interconnects. In some embodiments, the via 308 may be formed by mechanical drilling an aperture through the substrate assembly 302. The via 308 can be formed through the substrate assembly 302 utilizing one or more photolithography and etching techniques. For instance, once the substrate assembly 302 is patterned, an etch to remove the various insulation layers (e.g., passivation layers), silicon layers, adhesive material, etc., is performed. It is contemplated that various etching techniques (e.g., dry etch, wet etch, etc.) may be utilized depending on the requirements of the sensor package 300, the via 308, and so forth.

Forming a redistribution layer can include depositing a conductive material (e.g., copper, aluminum, etc.) in the via 308 to form an electrical interconnection between the redistribution layer 306, the sensor die 304, another die, and/or contact pads 310. In one or more implementations, the conductive material can be selectively plated-up using electroplating in order to form the electrical interconnections. Moreover, in one or more implementations, the conductive material deposited in the via 308 may also serve as the conductive material utilized for a redistribution structure, such as the redistribution structure 306 shown in FIGS. 1A, 1B, and 3C. Thus, the deposition of the conductive material in the via 308 may also result in the formation of a redistribution layer 306. The redistribution layer 306 may also be formed by depositing metal lines from the via 308 to contact pads 310 on the interconnect side of the sensor package 300 and/or the sensor die 304.

Figure 3D:
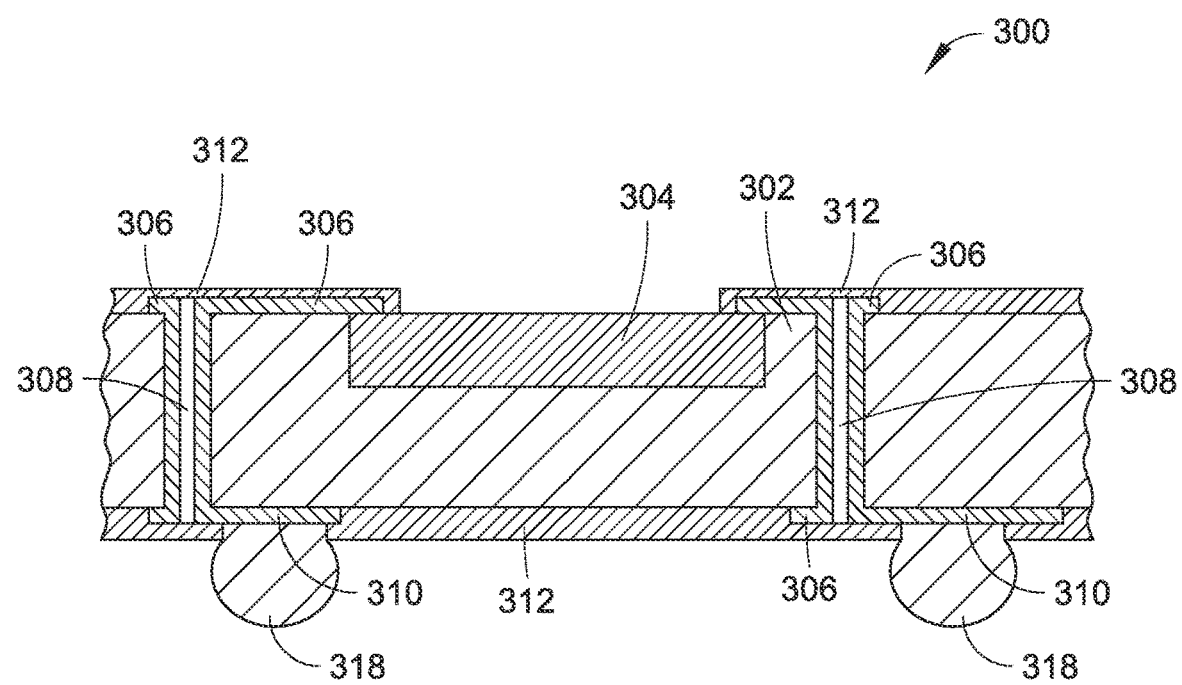
FIG. 3D is a diagrammatic partial cross-sectional side elevation view illustrating the fabrication of a sensor package, such as the device shown in FIGS. 1A and 1B, in accordance with the process shown in FIG. 2.

A passivation layer is formed over a surface of the sensor package (Block 210). As illustrated in FIG. 3D, a passivation layer 312 can be formed over the surface of the substrate assembly 302 in order to electrically isolate components of the sensor package 300 and/or to protect the sensor package 300 from environmental factors. In an embodiment, a passivation layer 312 (e.g., an oxide material, a thin film, a polymer, etc.) is formed over a surface of the substrate assembly 302. The passivation layer 312 can be deposited via one or more suitable deposition techniques, such as printing, spray coating, lamination, physical vapor deposition, chemical vapor deposition, molecular beam epitaxy, and so forth. In some embodiments, the passivation layer 312 may be etched to at least partially expose the contact pads 310, the sensor die 304, and/or other package components requiring exposure.

As shown in FIG. 3D, a solder bump is placed onto the substrate assembly and contact pads (Block 212). In an implementation, placing and/or forming a solder bump 318 includes forming an array of solder bumps 318 on an array of contact pads 310. In some embodiments, the solder bump(s) 318 may be held to the contact pad(s) 310, for example by flux, until the substrate assembly 302 and/or sensor package 300 is subjected to a suitable reflow process. The solder bump 318 may then be reflowed.

It is contemplated that further semiconductor fabrication techniques may be utilized to finalize the sensor package 300 fabrication process. For instance, further stripping of photoresist, etching of seed and barrier metals to electrically isolate plated-up lines, and depositing of passivation layers may be incorporated. For example, seed and barrier metal in unplated areas may be removed to form the electrical interconnections. In one implementation, sensor package may be placed and/or attached to a printed circuit board or other electrical device.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A sensor package, comprising:
a substrate assembly consisting of a portion of a semiconductor wafer;
at least one sensor die disposed in a cavity of the substrate assembly, the at least one sensor die having an active side, where the substrate assembly embeds the at least one sensor die such that the active side is the only side of the sensor die physically exposed to outside the substrate assembly and the sensor package, wherein the sensor package may be substantially flat on a side of the sensor package where the at least one sensor die is disposed, and wherein the at least one sensor die is electrically coupled to the sensor package through one or more conductive layers; and
at least one via formed in the substrate assembly and extending at least partially through the substrate assembly from one side of the sensor package to an opposite side of the sensor package;
wherein the one or more conductive layers are configured to provide electrical interconnection between the at least one sensor die and the sensor package, the one or more conductively layers comprising:

at least one redistribution layer coupled to the active side of a respective sensor die, wherein the at least one redistribution layer comprises an array of solder bumps evenly deployed over the sensor package;

at least one contact pad coupled to a respective redistribution layer by a corresponding via and configured to provide an electrical connection between the sensor die and the printed circuit board;

a passivation layer formed on at least one surface of the sensor package and comprising an electrical insulator; and at least one additional die embedded in the substrate assembly and electrically connected to the sensor package.

2. The sensor package as recited in claim 1, wherein the substrate assembly comprises a substrate.

3. The sensor package as recited in claim 1, wherein the at least one sensor die comprises an optical sensor.

4. The sensor package as recited in claim 1, wherein the at least one sensor die comprises at least one of a protective layer or a filter layer.

5. The sensor package as recited in claim 1, wherein the at least one sensor die comprises a sensor die located on a side of the substrate assembly opposite a side including at least one device interconnect.

6. The sensor package as recited in claim 5, wherein the at least one device interconnect comprises at least one solder bump formed on a respective contact pad.

7. The sensor package as recited in claim 1, wherein the sensor package includes at least one side that has a topology less than about 75 µm.

8. An electronic device, comprising:
a printed circuit board; and
a sensor package coupled to the printed circuit board, the sensor package comprising:
  a substrate assembly consisting of a portion of a semiconductor wafer;
  at least one sensor die disposed in a cavity of the substrate assembly, the at least one sensor die having an active side, where the substrate assembly embeds the at least one sensor die such that the active side of the at least one sensor die is the only side of the at least one sensor die physically exposed to outside the substrate assembly and the sensor package, wherein the sensor package may be substantially flat on a side of the sensor package where the at least one sensor die is disposed, and wherein the at least one sensor die is electrically coupled to the sensor package through one or more conductive layers; and
  at least one via formed in the substrate assembly and extending at least partially through the substrate assembly from the side of the sensor package to an opposite side of the sensor package;
  wherein the one or more conductive layers are configured to provide electrical interconnection between the at least one sensor die and the sensor package, the one or more conductive layers comprising:
    at least one redistribution layer coupled to the active side of a respective sensor die wherein the at least one redistribution layer comprises an array of solder bumps evenly deployed over the sensor package;
    at least one contact pad coupled to a respective redistribution layer by a corresponding via and configured to provide an electrical connection between the sensor die and the printed circuit board;
    at least one additional die embedded in the substrate assembly and electrically connected to the sensor package; and
    a passivation layer formed on at least one surface of the sensor package and comprising an electrical insulator.

9. The electronic device as recited in claim 8, wherein the at least one sensor die comprises at least one of a protective layer or a filter layer.

10. The electronic device as recited in claim 8, wherein the at least one sensor die comprises a sensor die located on a side of the substrate opposite a side including at least one device interconnect.

11. The electronic device as recited in claim 10, wherein the at least one device interconnect comprises at least one solder bump formed on a respective contact pad.

12. The electronic device as recited in claim 8, wherein the sensor package includes at least one side that has a topology less than about 75 µm.

13. A process for fabricating a sensor package, comprising:
placing at least one sensor die in a cavity of a substrate assembly consisting of a portion of a semiconductor wafer, where the substrate assembly embeds the at least one sensor die such that an active side of the at least one sensor die is the only side that is physically exposed to outside the substrate assembly and the sensor package, the substrate assembly including at least one additional die embedded in the substrate assembly, wherein the sensor package may be substantially flat on a side of the sensor package where the at least one sensor die is disposed; and
electrically coupling the at least one sensor die to the sensor package through one or more conductive layers, comprising:
  forming at least one redistribution layer coupled to a corresponding active side of a respective sensor die, wherein the at least one redistribution layer comprises an array of solder bumps evenly deployed over the sensor package;
  forming at least one via in the substrate assembly, the at least one via coupled to at least one redistribution layer and extending at least partially through the substrate assembly from the side of the sensor package to an opposite side of the sensor package;
  forming at least one contact pad configured to provide an electrical connection between the sensor die and the printed circuit board; and
  forming a passivation layer on at least one surface of the sensor package comprising an electrical insulator.

14. The process for fabricating an sensor package as recited in claim 13, wherein placing at least one sensor die on a substrate assembly comprises placing the sensor die on a side of the substrate assembly distal from an interconnect side of the substrate assembly.

15. The process for fabricating a sensor package as recited in claim 13, wherein placing at least one sensor die on a substrate assembly comprises placing at least one sensor die on a semiconductor substrate.

16. The process for fabricating a sensor package as recited in claim 13, wherein placing at least one sensor die on a substrate assembly comprises placing at least one sensor die in an etched portion of the substrate assembly.

17. The process for fabricating a sensor package as recited in claim 13, wherein placing at least one sensor die on a substrate assembly comprises placing at least one of a color filter or a protective layer over the sensor die.

18. The process for fabricating a sensor package as recited in claim 13, wherein forming at least one contact pad comprises forming a metal contact pad.

19. The process for fabricating a sensor package as recited in claim 13, wherein forming a passivation layer on at least one surface of the sensor package comprises forming a passivation layer so that topology is less than about 75 μm.

* * * * *